(12) United States Patent
Maeda et al.

(10) Patent No.: US 9,718,234 B2
(45) Date of Patent: Aug. 1, 2017

(54) IMPRINT LITHOGRAPHY APPARATUS AND DEVICE MANUFACTURING METHOD THEREFOR

(71) Applicant: CANON KABUSHIKI KAISHA, Tokyo (JP)

(72) Inventors: Hironori Maeda, Utsunomiya (JP); Seiya Miura, Utsunomiya (JP); Kazuhiko Mishima, Utsunomiya (JP); Ken Minoda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 618 days.

(21) Appl. No.: 13/716,428

(22) Filed: Dec. 17, 2012

(65) Prior Publication Data
US 2013/0161868 A1    Jun. 27, 2013

(30) Foreign Application Priority Data

Dec. 22, 2011    (WO) .................. PCT/JP2011/079911

(51) Int. Cl.
*B29C 59/16*      (2006.01)
*G03F 7/00*      (2006.01)
(Continued)

(52) U.S. Cl.
CPC .............. *B29C 59/16* (2013.01); *B82Y 10/00* (2013.01); *B82Y 40/00* (2013.01); *G03F 7/0002* (2013.01)

(58) Field of Classification Search
CPC ....... B29C 59/16; G03F 7/0002; B82Y 10/00; B82Y 40/00
(Continued)

(56) References Cited

U.S. PATENT DOCUMENTS

2004/0170105 A1*   9/2004   Jutte ........................ 369/112.01
2009/0108483 A1*   4/2009   Suehira et al. .............. 264/40.5
(Continued)

FOREIGN PATENT DOCUMENTS

JP           11248417 A      9/1999
JP       2005286062 A     10/2005
(Continued)

OTHER PUBLICATIONS

Jp11248417 english translation.*
English Translation for JP11248417.*

*Primary Examiner* — Alison L Hindenlang
*Assistant Examiner* — Mohamed K Ahmed Ali
(74) *Attorney, Agent, or Firm* — Canon USA Inc., IP Division

(57) ABSTRACT

An imprint lithography apparatus uses a mold having a pattern formed thereon and transfers the pattern to an imprint material fed to a substrate. The apparatus includes a light-receiving element; a detection system that irradiates a mark formed on the substrate and a mark formed on the mold with light which is reflected therefrom, and guides the light reflected from the mark formed on the substrate and from the mark formed on the mold to the light-receiving element; a relay optical system that causes the light reflected to focus between the mold and the detection system; an illumination system that emits illumination light for curing the imprint material; an optical element having a surface that transmits one of the illumination light and the light from the detection system and reflects the other; and a plate-shaped optical member that corrects aberration of the relay optical system.

13 Claims, 11 Drawing Sheets

(51) Int. Cl.
  *B82Y 10/00* (2011.01)
  *B82Y 40/00* (2011.01)
(58) Field of Classification Search
  USPC .......................................... 264/293; 425/171
  See application file for complete search history.

(56) References Cited

U.S. PATENT DOCUMENTS

2010/0195102 A1* 8/2010 Den Boef ............. B29C 43/021
  356/401
2011/0278768 A1* 11/2011 Sato ....................... B82Y 10/00
  264/406

FOREIGN PATENT DOCUMENTS

| | | | |
|---|---|---|---|
| JP | 2011003616 A | 1/2011 | |
| JP | 2011103448 A | 5/2011 | |

\* cited by examiner

IMPRINT LITHOGRAPHY APPARATUS AND DEVICE MANUFACTURING METHOD THEREFOR

TECHNICAL FIELD

The present invention relates to correction for astigmatism of an optical system applicable to an imprint lithography apparatus that transfers a pattern formed on a mold to an imprint material on a substrate.

BACKGROUND ART

As demand for reduction in size of a semiconductor device is increased, an imprint lithography technique is becoming popular. The imprint lithography technique is a nonconventional technique which forms a pattern by bringing a pattern formed on a mold into contact with an imprint material fed on a substrate (by impressing the pattern to the imprint material).

An optical imprint lithography method is described as an example of this imprint lithography technique. First, a layer made of photo-curable resin (hereinafter, imprint resin) is formed on a substrate (for example, a semiconductor wafer). Then, a mold having a desirable structure with fine relief pattern (a pattern) is brought into contact with the imprint resin. Then, the imprint resin is irradiated with ultraviolet rays and hence cured while the imprint resin is in contact with the mold. Thus, the pattern formed on the mold can be transferred to the imprint resin.

The imprint lithography apparatus performs alignment every shot before the mold is brought into contact with the imprint resin. For the alignment by the imprint lithography apparatus, a through-the-mold detection system (hereinafter, TTM detection system) has been used. The TTM detection system can perform alignment by simultaneously detecting marks formed on the mold and the wafer. Patent Literature (PTL) document 1 describes an imprint lithography apparatus in which an illumination system that irradiates a resin layer with ultraviolet rays from above the mold through the mold is arranged above the mold, and a TTM detection system is arranged in a manner that does not interfere with the illumination system.

CITATION LIST

Patent Literature

PTL 1 Japanese Patent Laid-Open No. 2005-286062

The TTM detection system has had to be arranged with an inclination with respect to the optical axis of the illumination system in order to avoid interference with the illumination system or an illumination light beam. Since the wafer has been aligned by the TTM detection system arranged with the inclination with respect to the optical axis of the illumination system, the TTM detection system has been arranged by Littrow configuration and has detected a signal by acquiring light diffracted at a Littrow angle. However, with the TTM detection system arranged by the Littrow configuration, a numerical aperture (NA) of the TTM detection system cannot be sufficiently increased due to the limitation of arrangement. Hence, the quantity of detection light is small, and alignment accuracy lacks the high precision desired in this type of lithographic systems.

Owing to the foregoing state of the art, an object of the present invention is to increase the alignment accuracy between the substrate and the mold by increasing the numerical aperture in the TTM detection system of an imprint lithography apparatus.

SUMMARY OF INVENTION

An imprint lithography apparatus according to the present invention uses a mold having a pattern formed thereon and transfers the pattern to an imprint material fed to a substrate. The imprint lithography apparatus includes a light-receiving element; a detection system that irradiates a mark formed on the substrate and a mark formed on the mold with light which is reflected therefrom, and guides the light reflected from the mark formed on the substrate and from the mark formed on the mold to the light-receiving element; a relay optical system that causes the light reflected through the mold from the mark formed on the substrate and the mark formed on the mold to be focused between the mold and the detection system; an illumination system that emits illumination light for curing the imprint material; an optical element having a surface that transmits one of the illumination light and the light from the detection system and reflects the other; and a plate-shaped optical member that corrects aberration of the relay optical system. The optical member is arranged in the relay optical system, and an inclination direction of the optical member is different from an inclination direction of the surface of the optical element.

Further features of the present invention will become apparent from the following description of exemplary embodiments with reference to the attached drawings.

DESCRIPTION OF EMBODIMENTS

Figure 1:
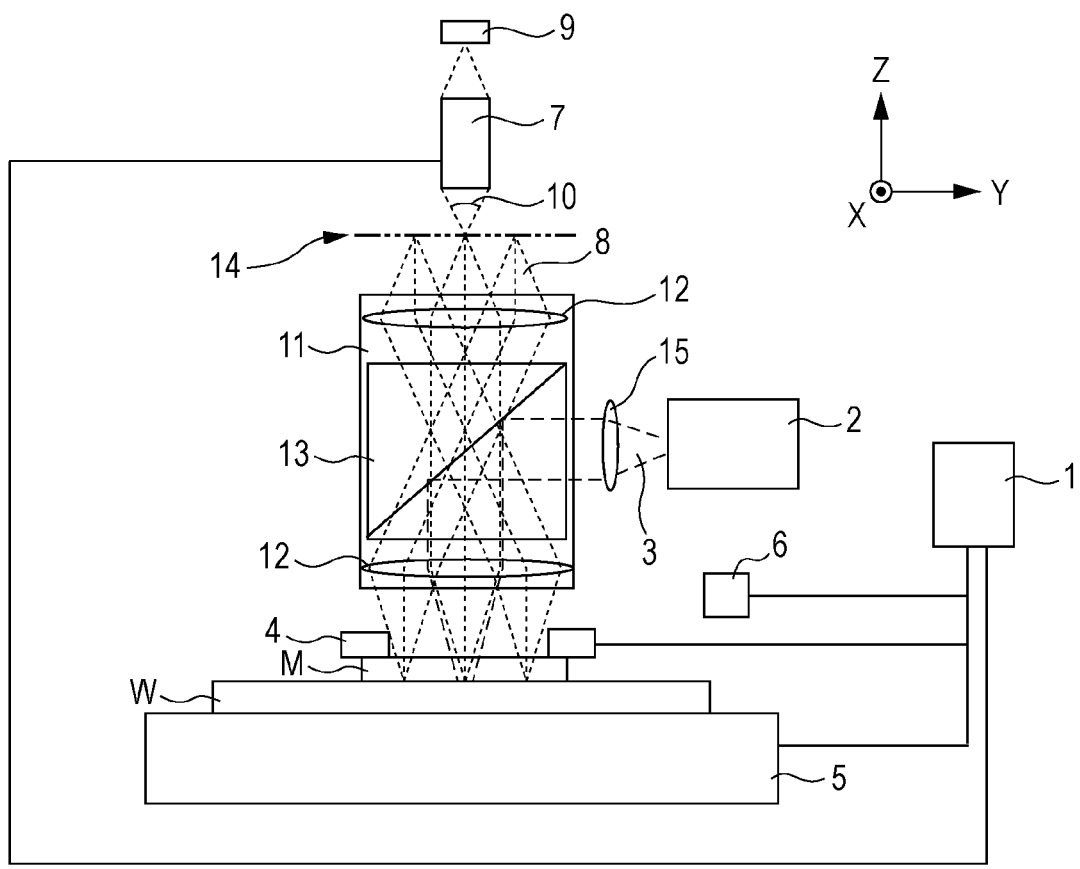
FIG. 1 illustrates an imprint lithography apparatus including a relay optical system.

An exemplary embodiment of the present invention is described below in detail with reference to the accompanying drawings. In the drawings, the same reference signs refer the same members, and redundant description is omitted.

First Embodiment

An imprint lithography apparatus (imprint apparatus) is described with reference to FIG. 1. FIG. 1 illustrates an imprint lithography apparatus 100 including a relay optical system. Respective three-dimensional axes are determined as illustrated such that the Z direction is the height direction of the imprint lithography apparatus 100 and the XY plane is the plane where a substrate (a wafer W) is arranged perpendicular to the Z axis (Z direction).

As shown in FIG. 1, the imprint lithography apparatus 100 includes an illumination system 2 (exposure light system) that emits ultraviolet rays 3 for curing imprint resin, a mold holder (an imprint head 4) that holds a mold (a mold M), and a substrate holder (a wafer stage 5) that holds a wafer W. Further, the imprint lithography apparatus 100 includes a feed unit 6 that feeds imprint resin to the substrate W, a TTM detection system 7 (a through-the-mold detection system), and a control unit 1.

The TTM detection system 7 (measurement light system) serves to detect the position of the mold M with respect to the position of the wafer W by detecting a mold alignment mark (not shown) formed on the mold M and a wafer alignment mark (not shown) formed on the wafer W. Based on a signal (position signal) provided by the TTM detection system 7, a control unit 1 can iteratively align the position of the mold M with respect to the position of the wafer W. To that end, the TTM detection system 7 irradiates the mold alignment mark and the wafer alignment mark with measurement light 8 by using a light source provided therein. The measurement light 8 may be visible light or infrared rays. Reflection light from the mold alignment mark and the wafer alignment mark passes through the TTM detection system 7 and is detected by a sensor 9 (a light-receiving element) for the TTM detection system. The sensor 9 for detecting reflection light is formed of a photoelectric conversion element such as a CCD camera.

By aligning the positions and focusing states of the mold alignment mark and the wafer alignment mark, the relative positional relationships (X, Y, Z) of the mold M and the wafer W can be aligned. The detection result of the TTM detection system 7 is output to the control unit 1. The control unit 1 moves the imprint head 4 or the wafer stage 5 in the X and Y directions in accordance with the detection result of the TTM detection system 7. Accordingly, the positions of the mold M and the wafer W in the X and Y directions can be adjusted.

During the position measurement for the mold M and the wafer W by the TTM detection system 7, monochromatic light may generate interference fringes because of the imprint resin fed onto the wafer alignment mark or a formed transparent layer. Hence, detection is made while a signal of interference fringes is added to a signal used for the alignment. The detection accuracy may be decreased. Therefore, the illumination light source of the TTM detection system 7 preferably uses light with a wavelength in a wide band, except a band of wavelengths of light (exposure light) used for an illumination system, which is described later. That is, the illumination light source of the TTM detection system 7 preferably has a wavelength that does not cure the imprint material fed onto the wafer. In other words, it is preferable that the illumination light source of the TTM detection system 7 has a wavelength different from a wavelength of light used for curing the imprint material.

In the imprint lithography apparatus 100, the pattern formed on the mold M is transferred by impressing the pattern onto the imprint material. An imprint operation for transferring the pattern is described.

First, the imprint resin is fed to a shot region on the wafer W to which the pattern is desired to be transferred, by using the feed unit 6. The wafer stage 5 moves so that the wafer W fed with the imprint resin is positioned below the pattern portion formed on the mold M. The positions of the mold M and the wafer W are aligned, and then the pattern formed on the mold M is brought into contact with the imprint resin already deposited on the wafer W (this is referred-to as a pressing step). Then, while the mold M is in contact with the imprint resin, ultraviolet rays (curing light) 3 are emitted from the illumination system 2, and hence the imprint resin is cured (a curing step). After the imprint resin is cured, at lease one of the imprint head 4 and the wafer stage 5 is moved, and the mold M is released from the imprint resin (a releasing step). In this manner, the pattern formed on the mold M has been transferred to the imprint resin. By repeating this imprint operation in a plurality of shot regions arranged on the wafer W, the pattern can be transferred to all shot regions on the wafer W. As used herein, a shot region is a substrate region which when exposed to radiant energy (exposure light) at least one device can be manufactured therein. Accordingly, when the substrate (wafer W) includes a plurality of shot regions (shot region array) at least one device may be manufactured from each of the plurality of shot regions by the process of lithographic imprint described above.

In this embodiment, the ultraviolet rays are used as the illumination light. However, the wavelength of the illumination light can be appropriately determined in accordance with the kind of imprint resin fed onto the substrate.

In a conventional imprint lithography apparatus, the TTM detection system 7 was arranged to avoid interfere with an illumination light beam of the illumination system 2 and the ultraviolet rays 3. Thus, the numerical aperture (NA) of the TTM detection system 7 could not be sufficiently increased. Since the TTM detection system 7 simultaneously detects the alignment marks formed on the mold M and the wafer W, the TTM detection system 7 has to be arranged above the mold M. Here, the numerical aperture (NA) is a value determined by a maximum angle θ of rays incident on the TTM detection system 7 with respect to the optical axis of the TTM detection system. An angle 10 in FIG. 1 is 2θ.

The NA of the TTM detection system 7 also depends on the size of the TTM detection system 7. The TTM detection system 7 arranged to avoid interfere with an illumination light beam of the illumination system 2 and the ultraviolet rays 3 could not be increased in size. Hence the NA could not be increased. If the NA of the TTM detection system 7 cannot be sufficiently increased, the light quantity during the alignment is decreased, and the alignment accuracy is decreased.

In the imprint lithography apparatus 100 in FIG. 1, a relay optical system 11 is arranged above the mold M. A lens 12 and a beam splitter 13 (an optical element) are arranged in the relay optical system 11. The lens 12 can generate a conjugate plane (a wafer-surface image plane 14) in which a wafer surface is focused, at a position above the mold M. The relay optical system 11 has a function of focusing measurement light 8 on the wafer surface. As long as the wafer surface is focused, the magnification of the relay optical system 11 may be at 1× magnification, or the relay optical system 11 may be a magnified system.

The TTM detection system 7 is arranged above the relay optical system 11. The measurement light 8 (non-curing light) emitted from the TTM detection system 7 passes through the lens 12 and the beam splitter 13 in the relay optical system 11, and is transmitted onto the mold M and the wafer W. Reflection light from the mold M and the wafer W passes through the TTM detection system 7, and is detected by the sensor 9 of the TTM detection system. The positions of the mold M and the wafer W are aligned by operation of the control unit 1 on the basis of a detection signal obtained from sensor 9.

In the imprint lithography apparatus 100, the illumination system 2 is only required to irradiate the imprint resin with the ultraviolet rays 3 after the pressing of the mold M and the wafer W. The ultraviolet rays 3 emitted from the illumination system 2 are preferably made to impinge perpendicularly on the wafer W. In this manner, the illumination system 2 is not arranged in a crowded area of the arrangement above the mold M, but is arranged in a space with a margin in view of arrangement, like the TTM detection system 7.

The ultraviolet rays 3 emitted from the illumination system 2 pass through a lens 15 for the illumination system, are guided to the beam splitter 13, then are reflected by the beam splitter 13, are transmitted through the lens 12 in the relay optical system, and illuminate the imprint resin on the wafer W. The beam splitter 13 has a surface that transmits or reflects light with a specific wavelength. Since the beam splitter 13 is arranged in the relay optical system, both the TTM detection system 7 with a large NA and the illumination system 2 are arranged above the mold M, and both the measurement light 8 and the illumination light from the illumination system 2 can be perpendicularly incident on the wafer surface. The optical path of the measurement light 8 and the optical path of the ultraviolet rays 3 emitted from the illumination system 2 are partly common to each other. The beam splitter 13 has characteristics of transmitting the measurement light and reflecting the illumination light.

The relay optical system 11 is formed between the TTM detection system 7 and the mold M. The relay optical system 11 is a telecentric optical system (off-axis principal rays being parallel to the optical axis) in which the entire plane of the shot region is focused with the non-curing light. Hence, by changing the positions of the TTM detection system 7 and the sensor 9, the respective points of a plurality of wafer alignment marks formed in the shot region can be measured. If the relay optical system 11 is the telecentric optical system, since the off-axis principal rays are parallel to the optical axis, the image height of the TTM detection system 7 can be easily changed.

FIG. 1 shows an example in which three points on the wafer W are focused at the wafer-surface image plane 14. By changing the positions of the TTM detection system 7 and the sensor 9, different alignment marks formed in the shot can be measured. Although FIG. 1 does not illustrate refraction of rays in the beam splitter 13 for simplification, rays other than on-axis rays of the relay optical system 11 being perpendicularly incident on the beam splitter 13 are actually slightly shifted when being transmitted through the beam splitter 13.

As described above, since the imprint lithography apparatus 100 has arranged therein the relay optical system 11 including the beam splitter 13, the illumination system 2 and the TTM detection system 7 can be arranged in the space having a margin in view of the arrangement above the mold M. Since the TTM detection system 7 is arranged in the space with the margin in view of the arrangement, even if the TTM detection system 7 is increased in size, the TTM detection system 7 can be arranged. Hence, the NA of the TTM detection system 7 can be increased. By increasing the NA of the TTM detection system 7 that detects the alignment marks formed on the mold M and the wafer W, the quantity of light incident on the TTM detection system is increased, and hence the alignment accuracy can be increased. Also, superposition accuracy of the mold and the wafer during transferring of the pattern of the mold can be increased, thereby making a contribution to an increase in yield of the device.

In the description of FIG. 1, the beam splitter 13 has the characteristics of transmitting the measurement light 8 of the TTM detection system 7 and reflecting the ultraviolet rays 3 emitted from the illumination system 2. However, the characteristics of the beam splitter may be inverted. That is, the beam splitter is only required to have a surface that transmits one of the illumination light and the measurement light 8 and reflects the other. The beam splitter may have a shape in which two prisms are bonded like the beam splitter 13 in FIG. 1 or a beam splitter 16 shown in FIG. 2; or may have a flat-surface shape such as a beam splitter 20 shown in FIG. 3, which is described later. In any case, the beam splitter has a surface that transmits or reflects light with a specific wavelength.

Figure 2:
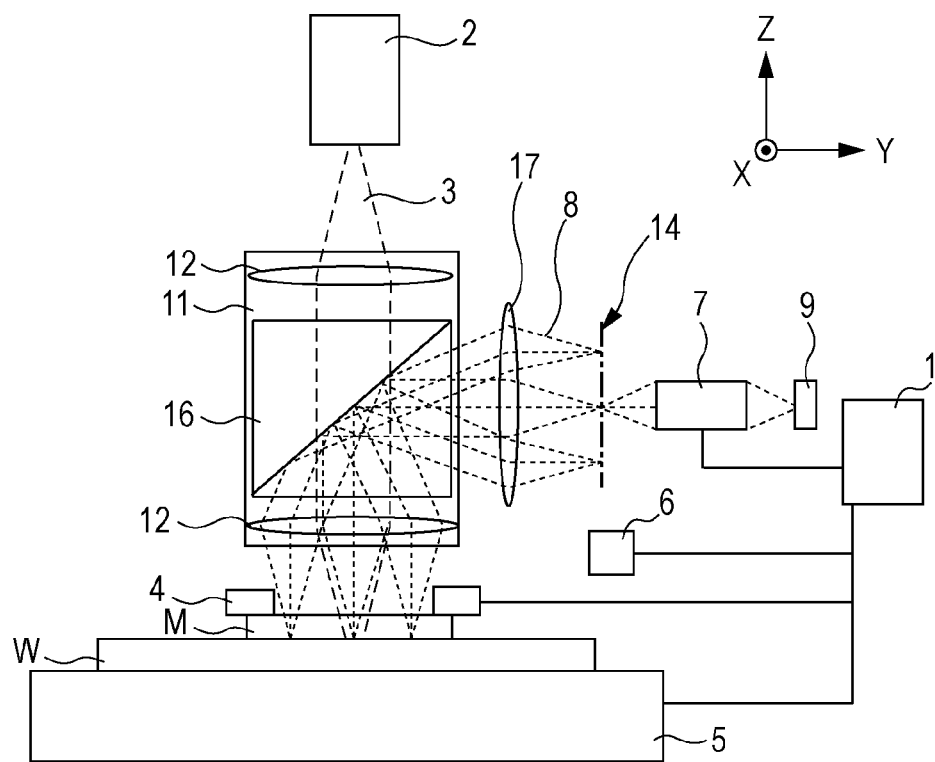
FIG. 2 illustrates an imprint lithography apparatus including a relay optical system.

FIG. 2 illustrates an imprint lithography apparatus 200 including a beam splitter 16 having characteristics of reflecting the measurement light 8 of the TTM detection system 7 and transmitting the ultraviolet rays 3 emitted from the illumination system 2. Like FIG. 1, the TTM detection system 7 that has a large NA and can provide alignment with high accuracy and the illumination system 2 can be arranged above the mold M.

The measurement light 8 emitted from the TTM detection system 7 is transmitted through a lens 17 for the TTM detection system, is guided to the beam splitter 16, is reflected by the beam splitter 16, is transmitted through the lens 12 in the relay optical system 11, and is emitted on the mold M and the wafer W. Reflection light from the mold M and the wafer W passes through the TTM detection system 7 and is detected by the sensor 9 for the TTM detection system. The positions of the mold M and the wafer W can be aligned on the basis of the detection signal. The lens 12 provided in the relay optical system 11 and the lens 17 for the TTM detection system form the wafer-surface image plane 14 in which the wafer surface is focused is formed above the mold M.

The ultraviolet rays 3 emitted from the illumination system 2 are transmitted through the lens 12 provided in the relay optical system 11, the beam splitter 16, and the mold M, and then is emitted on the imprint resin on the wafer W.

The imprint lithography apparatus 100 in FIG. 1 and the imprint lithography apparatus 200 in FIG. 2 are described as the imprint lithography apparatus including the beam splitter as the optical element that splits a light beam. However, the characteristics of the beam splitter do not have to be total reflection and total transmission. For example, the beam splitter 16 may reflect the measurement light 8 from the TTM detection system 7 by 90% and transmit the measurement light 8 by 10%; and may transmit the illumination light from the illumination system 2 by 90% and reflect the illumination light by 10%. Of course, the ratio of reflection to transmission of the beam splitter may not be 9:1 and may be 8:2, 7:3, or other ratio.

In the description of the imprint lithography apparatus in FIG. 1 or 2, the TTM detection system 7 has a configuration with a single route for simplification. However, the TTM detection system 7 may have a configuration with a plurality of routes. For example, if the TTM detection system 7 is configured of two routes, two different points in a single shot can be simultaneously measured, and the alignment can be provided with high accuracy. For example, X measurement and Y measurement can be simultaneously performed, and by measuring two different points in a shot, the shot shape can be corrected. The plurality of routes do not have to be two routes, and may be three or four routes.

Even if the TTM detection system 7 has a single route, by moving the wafer stage 5 or the TTM detection system 7, a plurality of positions of an alignment mark can be measured. However, if the apparatus is moved, the alignment accuracy may be decreased. Hereinafter, die-by-die alignment is described below; however, an alignment method may be a global alignment method.

The beam splitter of the above-described imprint lithography apparatus is arranged in the pupil space of the relay optical system 11. However, the beam splitter may not be arranged in the pupil space in view of the configuration of the relay optical system 11. If the beam splitter is not arranged in the pupil space of the relay optical system 11 but is arranged at a position near an object plane (an image plane), aberration may be generated. Correction for aberration when the beam splitter is arranged near the mold M is described.

Figure 3:
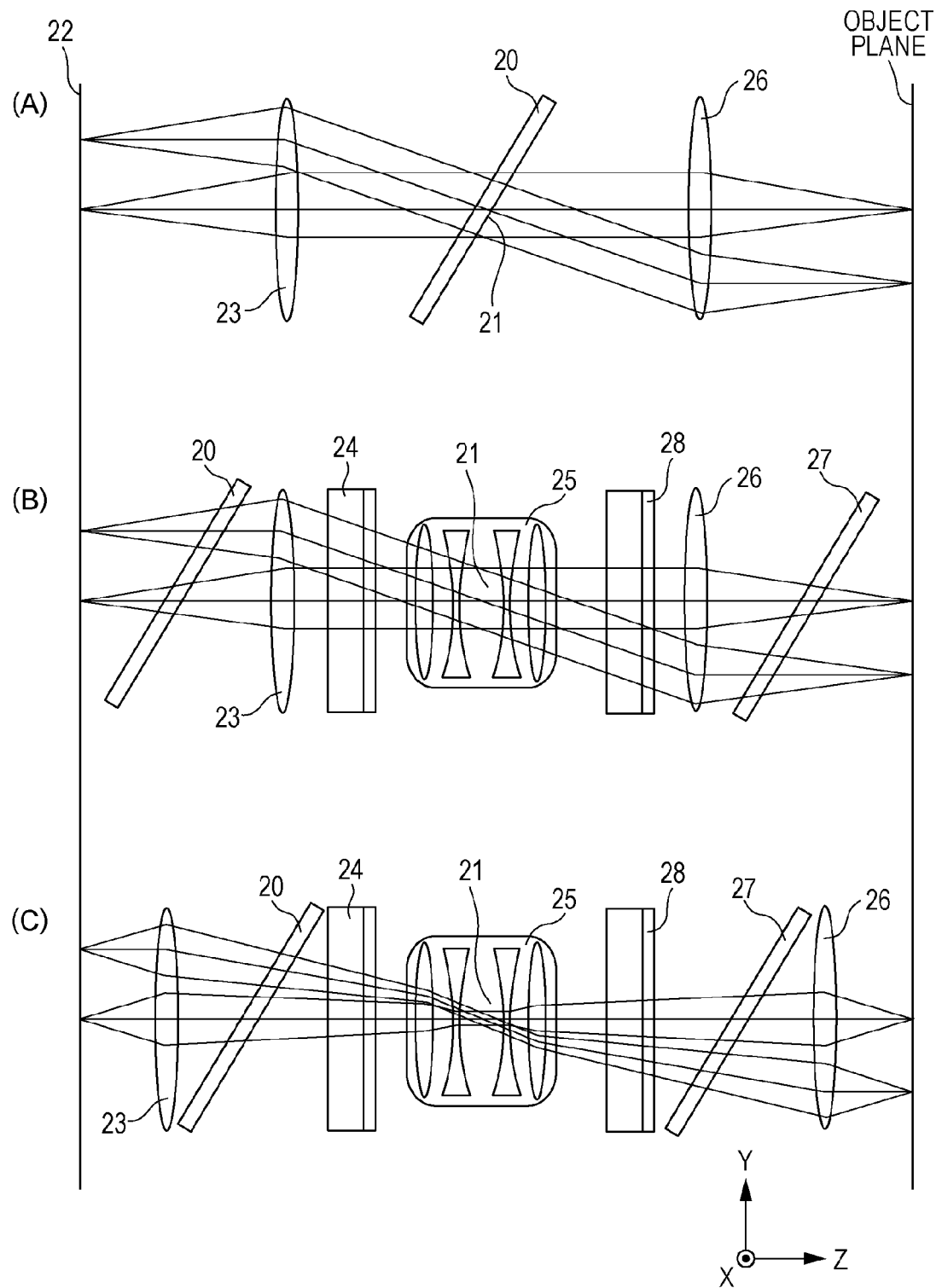
FIG. 3 illustrates states of an optical system when a parallel-plate-type beam splitter is arranged in the relay optical system and aberration is corrected.

Part (A) of FIG. 3 shows a case in which a parallel-plate-type beam splitter 20 is arranged in a pupil space. If the parallel-plate-type beam splitter 20 is arranged in a pupil space 21, all light of on-axis rays are transmitted through the beam splitter 20 in a parallel manner, and all light of off-axis rays are also transmitted through the beam splitter 20 in a parallel manner. In this manner, astigmatism can be minimized to be negligible. It is to be noted that the pupil space is a point at which on-axis principal rays intersect with off-axis principal rays.

However, in fact, a lens unit (a correction optical system 25) for correcting astigmatism has to be provided as shown in part (B) of FIG. 3, at a position near the pupil space 21 for correcting focusing aberration. Owing to this, the beam splitter 20 may be arranged in a space in a convergent light beam. If the beam splitter 20 is arranged at a position near the image plane 22, astigmatism and coma aberration may be generated.

Part (B) of FIG. 3 shows a state in which the parallel-plate-type beam splitter 20 is arranged in a telecentric space between the image plane 22 and a lens 23. In part (B) of FIG. 3, since on-axis rays and off-axis rays are incident at the same angle, astigmatism generated by the on-axis rays becomes the same as astigmatism generated by the off-axis rays. In part (B) of FIG. 3, the case in which the beam splitter 20 is arranged between the image plane 22 and the lens 23 is described. The outer diameter of the lens 23 can be decreased as the space is shorter. Hence, a space for arrangement of the beam splitter 20 may not be occasionally provided in this space.

Part (C) of FIG. 3 shows a state in which the beam splitter 20 is arranged in a space (in a convergent light beam) in which light is convergent between the lens 23 and a parallel plate 24. In part (C) of FIG. 3, on-axis rays are not incident at the same angle as the angle of off-axis rays. Hence, in addition to astigmatism having a component common to the on-axis rays and the off-axis rays, astigmatism depending on the image height is generated.

In part (A) to part (C) of FIG. 3, rays are bent by the beam splitter 20; however, illustration of refraction of rays by the beam splitter 20 and illustration of refraction at the correction optical system 25 in part (B) of FIG. 3 are omitted for simplification. In any part of FIG. 3, a plate-shaped optical member that corrects aberration of the optical system is arranged, and aberration is decreased.

Figure 4:
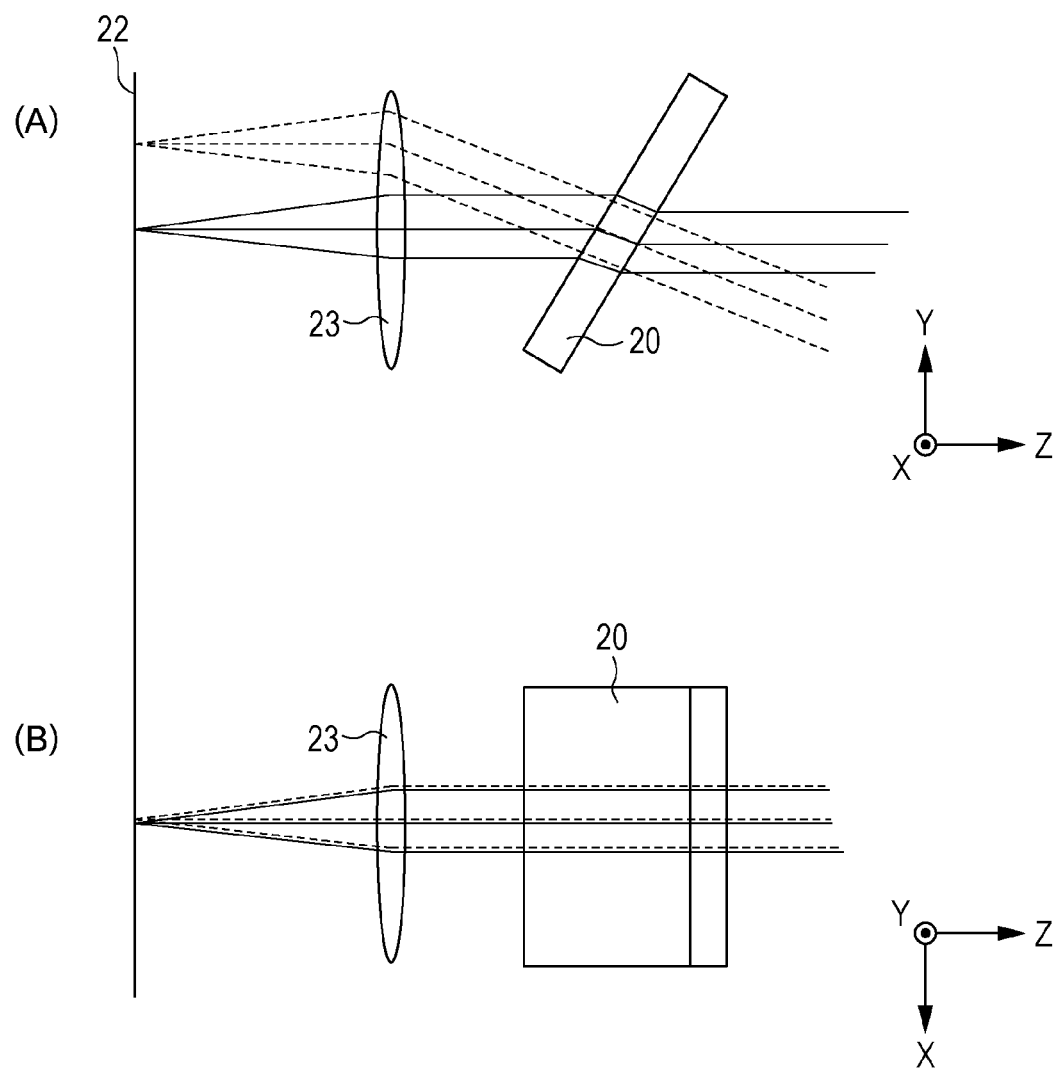
FIG. 4 provides enlarged view in an area near an image plane when a parallel plate is arranged in a pupil space.

FIG. 4 provides enlarged views in an area near the image plane 22 when the beam splitter 20 is arranged in the pupil space. The principle that astigmatism is not generated is described in detail with reference to part (A) and part (B) of FIG. 4.

In part (A) of FIG. 4, a paper-face parallel direction is a ZY plane, and a state in which on-axis rays (solid lines) and off-axis rays (dotted lines) are focused in the ZY plane is illustrated. In part (B) of FIG. 4, the paper-face parallel direction is a ZX plane, and a state in which on-axis rays and off-axis rays are focused in the ZX plane is illustrated. In both of part (A) and part (B) of FIG. 4, since the parallel-plate-type beam splitter 20 is arranged in the pupil space, all rays of the on-axis rays are incident on the beam splitter 20 at the same angle. In part (A) of FIG. 4, since all rays of the on-axis rays are incident on the beam splitter 20 at the same angle, the rays are shifted by the same amount at the parallel plate, and all light is focused at a single point in the image plane 22.

In part (B) of FIG. 4, since all light of the on-axis rays is perpendicularly incident at the same angle, the rays are not shifted by the beam splitter 20. However, all light is focused at a single point at the same Z position as the Z position of in part (A) of FIG. 4 in the image plane 22. As described above, since all light is focused at the same Z position in the ZX plane and the ZY plane, as long as the parallel-plate-type beam splitter 20 is arranged in the pupil space, it is found that on-axis astigmatism is not generated. Even off-axis astigmatism is not generated according to the similar principle. Also, both in part (A) and part (B) of FIG. 4, since all rays are focused at a single point, it is found that coma aberration is can be minimized to be negligible.

Figure 5:
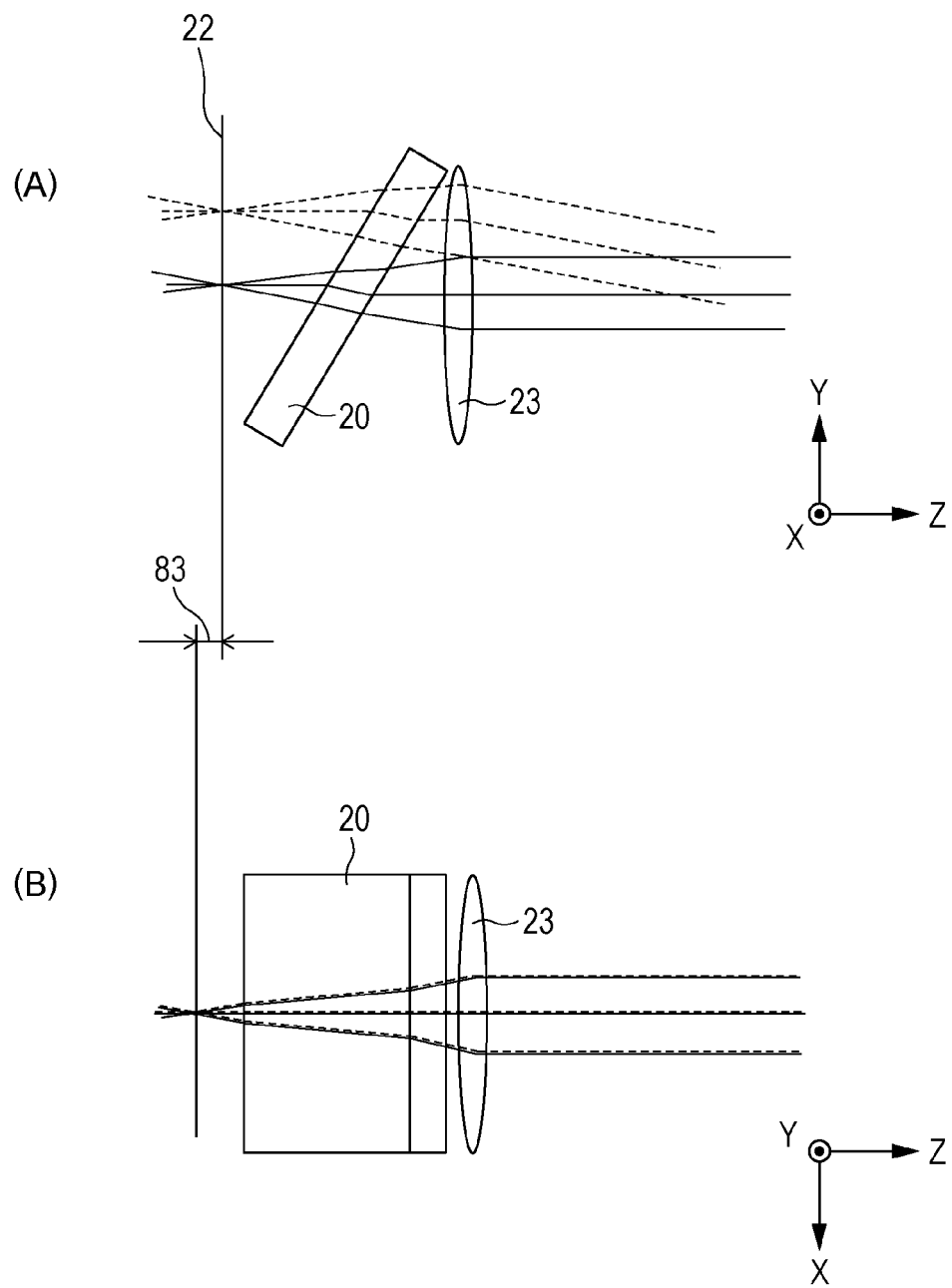
FIG. 5 provides enlarged views in the area near the image plane when the parallel plate is arranged in a convergent light beam.

FIG. 5 provides enlarged views in the area near the image plane 22 when the beam splitter 20 is arranged between the image plane 22 and the lens 23. The principle that astigmatism and coma aberration are generated is described in detail with reference to part (A) and part (B) of FIG. 5.

In part (A) of FIG. 5, the paper-face parallel direction is a ZY plane, and a state in which on-axis rays (solid lines) and off-axis rays (dotted lines) are focused in the ZY plane is illustrated. In part (B) of FIG. 5, the paper-face parallel direction is a ZX plane, and a state in which on-axis rays and off-axis rays are focused in the ZX plane is illustrated. In both of part (A) and part (B) of FIG. 5, since the parallel-plate-type beam splitter 20 is arranged in a convergent light beam between the lens 23 and the image plane 22, not all rays are incident on the parallel-plate-type beam splitter 20 at the same angle.

Comparing part (A) of FIG. 5 with part (B) of FIG. 5, it is found that the angles of rays incident on the beam splitter 20 are different. First, regarding on-axis principal rays, the on-axis principal rays are incident at an angle that is inclined by an inclination angle of the beam splitter 20 in part (A) of FIG. 5, whereas the on-axis principal rays are perpendicularly incident in part (B) of FIG. 5. As described above, since the angle of incidence on the beam splitter 20 in the ZX plane is different from that in the ZY plane, the shift amounts of the rays are different, and the image plane 22 on which the rays are focused have a shift amount in the Z direction between part (A) and part (B) of FIG. 5.

The shift amount in the image plane 22 between part (A) and part (B) of FIG. 5 indicates an astigmatism amount 83 generated because the parallel-plate-type beam splitter 20 is arranged in a convergent light beam. Regarding off-axis rays, an area between the lens 23 and the image plane 22 is a telecentric space. The angle of incidence of the on-axis rays on the beam splitter 20 is the same as the angle of incidence of the off-axis rays on the beam splitter 20. Hence, the astigmatism is generated by the off-axis astigmatism amount 83 that is the same as the on-axis astigmatism amount. Also, as shown in part (A) of FIG. 5, since the angle of incidence on the beam splitter 20 varies depending on the rays, not all light is focused at a single point in the image plane 22, and coma aberration is generated. In this way, if the beam splitter 20 is arranged in a convergent light beam, astigmatism and coma aberration are generated.

Figure 6:
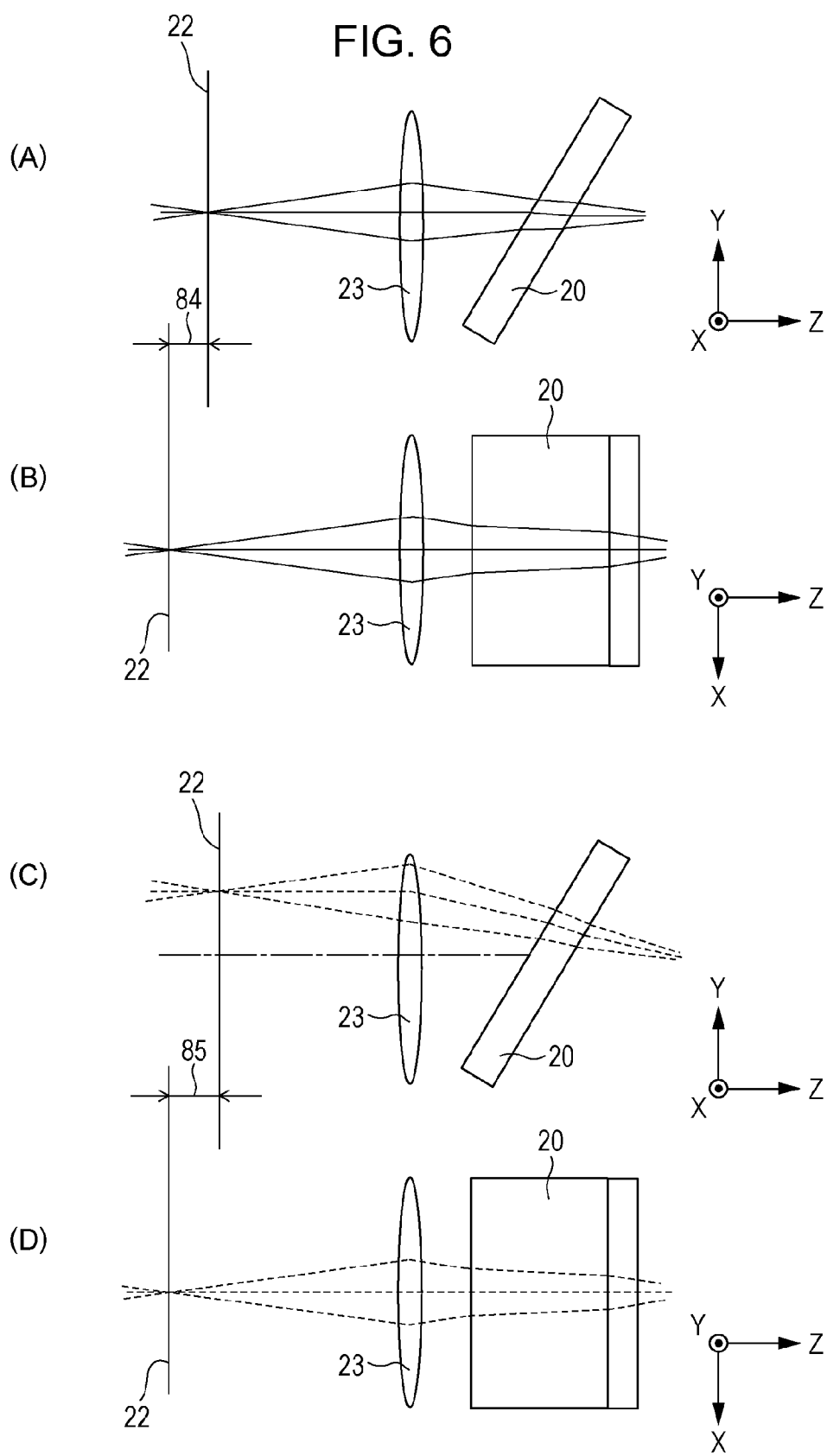
FIG. 6 illustrates astigmatism generated by beam splitters.

FIG. 6 provides enlarged views in the area near the image plane 22 when the beam splitter 20 is arranged in a convergent light beam. The principle that astigmatism and coma aberration are generated is described in detail with reference to part (A) to part (D) of FIG. 6. In part (A) and part (C) of FIG. 6, the paper-face parallel direction is a ZY plane, and focusing in the ZY plane is illustrated. Part (A) of FIG. 6 illustrates the trace of on-axis rays (solid lines) and part (C) of FIG. 6 illustrates the trace of off-axis rays (dotted lines). In part (B) and part (D) of FIG. 6, the paper-face parallel direction is a ZX plane, and focusing in the ZX plane is illustrated. Part (B) of FIG. 6 illustrates the trace of on-axis rays (solid lines) and part (D) of FIG. 6 illustrates the trace of off-axis rays (dotted lines).

In FIG. 6, the parallel-plate-type beam splitter 20 is arranged in a convergent light beam. Owing to this, not all rays are incident on the beam splitter 20 at the same angle. Also, comparing part (A) of FIG. 6 with part (B) of FIG. 6, the angles of rays incident on the beam splitter 20 are different. For example, regarding on-axis principal rays, the on-axis principal rays are incident at an angle that is inclined by an inclination angle of the beam splitter 20 in part (A) of FIG. 6, whereas the on-axis principal rays are perpendicularly incident in part (B) of FIG. 6. As described above, since the angle of incidence on the parallel plate in the ZY plane is different from that in the ZX plane, the shift amounts of the rays by the parallel-plate-type beam splitter 20 are different, and the image plane 22 in which the rays are focused have a shift amount in the Z direction between part (A) and part (B) of FIG. 6.

The shift amount in the image plane 22 between part (A) and part (B) of FIG. 6 indicates an astigmatism amount 84 generated because the parallel-plate-type beam splitter 20 is arranged in a convergent light beam. As shown in part (C) and part (D) of FIG. 6, the incidence angle of the off-axis rays on the beam splitter 20 is different from the incidence angle of the on-axis rays in part (A) and part (B) of FIG. 6, and an astigmatism amount 85 that is different from the astigmatism amount 84 generated at the on-axis is generated. Hence, with the arrangement of the beam splitter 20 in FIG. 6, in addition to the astigmatism having the component common to the on-axis rays and the off-axis rays, astigmatism depending on the image height is generated. Also, as shown in part (A) of FIG. 6, since the angle of incidence on the parallel plate varies depending on the rays, not all light is focused at a single point in the image plane, and coma aberration is generated. In this way, if the parallel-plate-type beam splitter 20 is arranged in a convergent light beam, astigmatism and coma aberration are generated.

Figure 7:
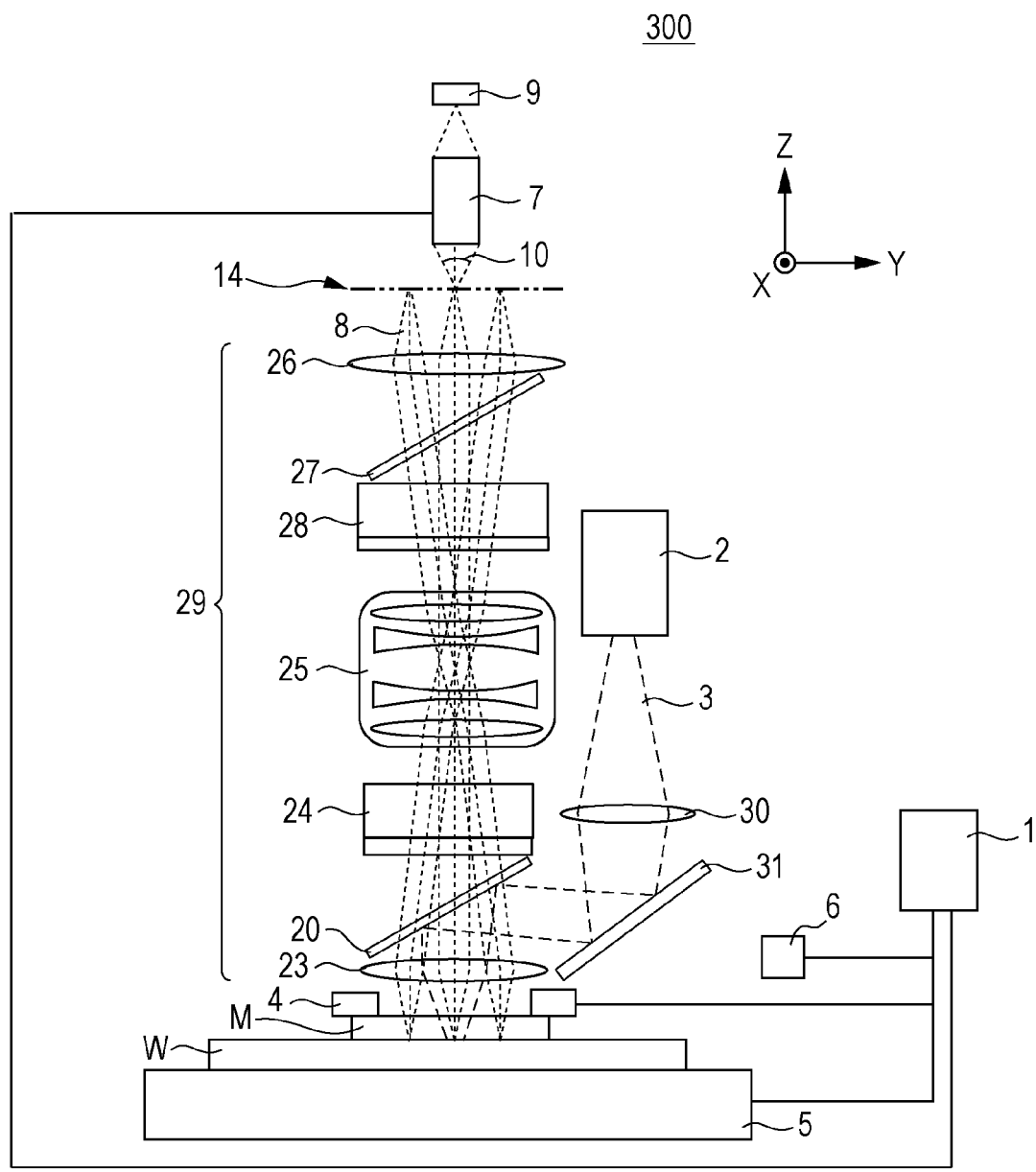
FIG. 7 illustrates an imprint lithography apparatus including an aberration correction mechanism.

FIG. 7 illustrates an imprint lithography apparatus 300 including an astigmatism correction mechanism and a coma aberration correction mechanism. In FIG. 7, the beam splitter 20 is arranged at a position near the image plane. Here, in the description, it is assumed that the wafer surface (the mold surface) is the object plane and the wafer-surface image plane 14 is the image plane.

The ultraviolet rays 3 emitted from the illumination system 2 pass through a lens 30 for the illumination system, are reflected by a folding mirror 31 for the illumination system, and are guided to the parallel-plate-type beam splitter 20. The rays reflected by the parallel-plate-type beam splitter 20 are transmitted through a lens 23 (an object-side lens) arranged at a mold side, are transmitted through the mold M, and reach the wafer W.

The measurement light 8 emitted from the TTM detection system 7 is transmitted through a lens 26 (an image-side lens) arranged at a detection system side, is transmitted through parallel plates 27 and 28 used for correcting coma aberration, and reaches the correction optical system 25 used for correcting astigmatism. The light transmitted through the correction optical system 25 is transmitted through the parallel plate 24 being a plate-shaped optical member used for correcting astigmatism, is transmitted through the parallel-plate-type beam splitter 20, is transmitted through the lens 23, and illuminates the mold M and the wafer W. Reflection light from the mold M and the wafer W passes through the TTM detection system 7, and is detected by the sensor 9 for the TTM detection system. The positions of the mold M and the wafer W are aligned on the basis of the detection signal.

In FIG. 7, the lenses 26 and 23, the parallel plates 27 and 28 for correcting coma aberration, the parallel plate 24 for correcting astigmatism, the correction optical system 25, and the parallel-plate-type beam splitter 20 form a relay optical system 29.

The relay optical system 29 forms an image plane (the wafer-surface image plane 14) conjugate to the wafer surface, at a position above the mold M. If a parallel plate is provided at an inclination in a convergent light beam, it is known that astigmatism and coma aberration are generated as shown in part (A) and part (B) of FIG. 5. In order to observe (capture) the alignment marks through the relay optical system 29, the astigmatism and the coma aberration generated at the parallel-plate-type beam splitter 20 have to be corrected.

To correct the astigmatism generated at the parallel-plate-type beam splitter 20, the parallel plate 24 used for correcting astigmatism is provided in the relay optical system 29. The parallel plate 24 used for correcting astigmatism is arranged obliquely with respect to the ZX plane. The parallel plate 24 has a role of canceling on-axis astigmatism generated at the parallel-plate-type beam splitter 20. Off-axis astigmatism, which is not completely corrected by the parallel plate 24 used for correcting astigmatism, is corrected by decentering the correction optical system 25 in the Y and X directions.

A method of correcting astigmatism by the parallel plate 24 and the correction optical system 25 is described with reference to FIGS. 8 and 9. With the description of part (A) to part (D) of FIG. 6, it was found that the astigmatism depending on the image height is generated because of the difference in incidence angle on the parallel plate.

Figure 8:
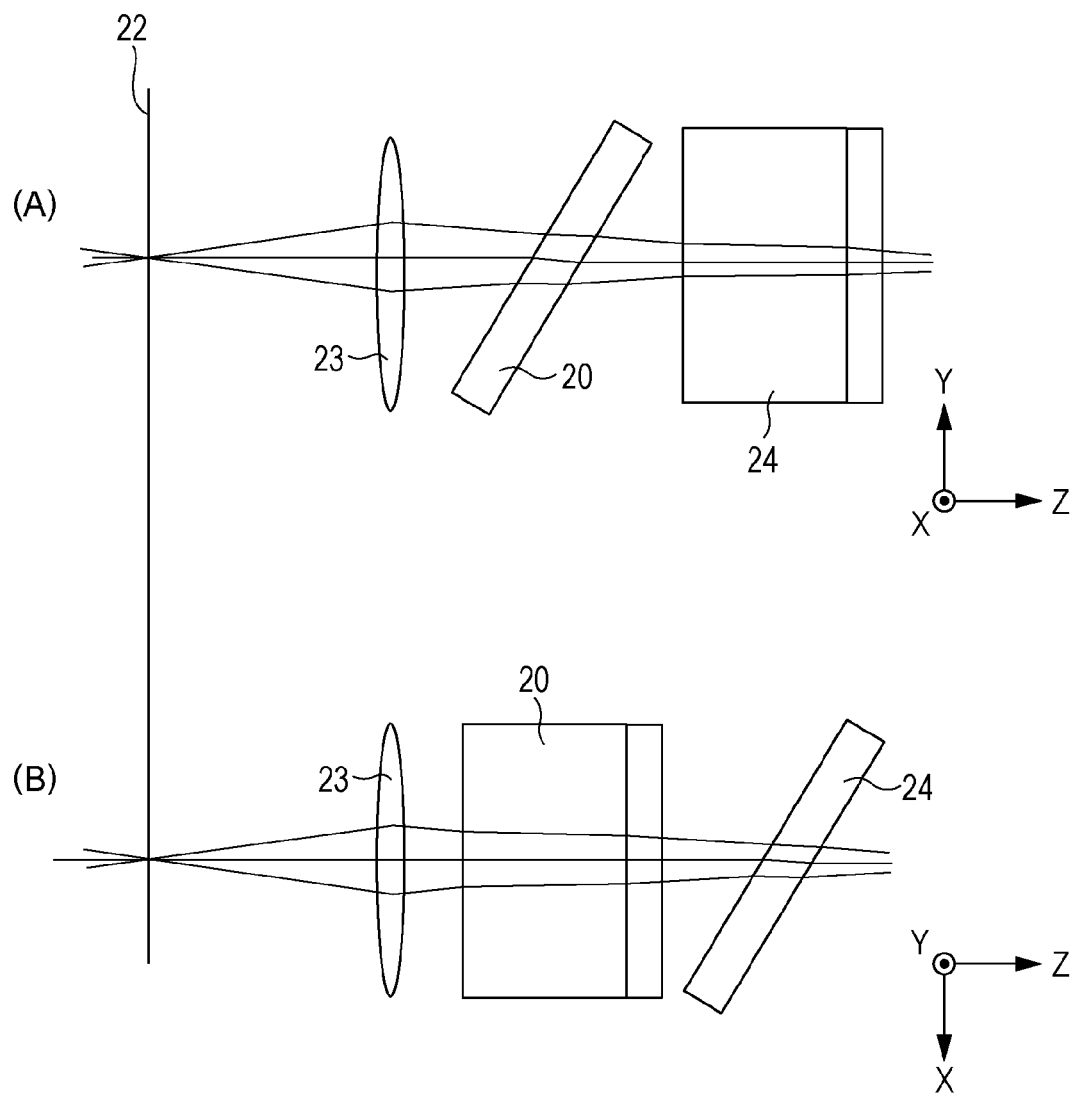
FIG. 8 illustrates correction of astigmatism by the parallel plate.

FIG. 8 provides enlarged views of the beam splitter 20 and the parallel plate 24 used for correcting astigmatism. Part (A) of FIG. 8 shows a YZ plane, and part (B) of FIG. 8 shows an XZ plane. A state is shown in which the parallel plate 24 cancels on-axis astigmatism generated at the parallel-plate-type beam splitter 20. It is to be noted that the parallel plate 24 is arranged in a rotated manner by 90 degrees while the same inclination as that of the parallel-plate-type beam splitter 20 is maintained.

In this case, a plane perpendicular to the optical axis of the relay optical system is considered as the reference. The beam splitter 20 is inclined in a direction of the Y-axis with respect to the plane perpendicular to the optical axis, and hence the inclination direction is the Y direction. The parallel plate 24 is inclined in a direction of the X-axis with respect to the plane perpendicular to the optical axis, and hence the inclination direction is the X direction. In this way, the inclination directions of the beam splitter 20 and the parallel plate 24 differ from one another. Also, the parallel plate 24 preferably has the same thickness and shape as those of the parallel-plate-type beam splitter 20.

In the YZ plane in part (A) of FIG. 6, on-axis astigmatism is generated by the parallel-plate-type beam splitter 20 as compared with the XZ plane in part (B) of FIG. 6. By arranging the parallel plate 24 for correcting astigmatism, in the XZ plane as shown in part (B) of FIG. 8, astigmatism is generated also in the XZ plane by the same amount as that in part (A) of FIG. 6. As shown in part (A) and part (B) of FIG. 8, it is found that on-axis aberration is can be minimized to be negligible in the YZ plane or the XZ plane.

Figure 9A:
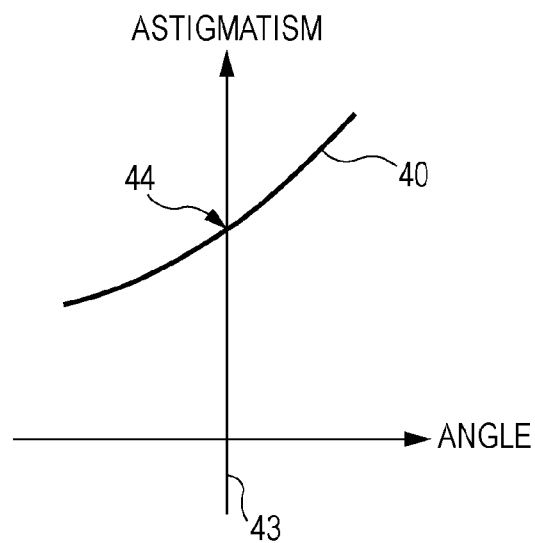
FIGS. 9A to 9C each illustrate astigmatism in accordance with an incidence angle.
Figure 9B:
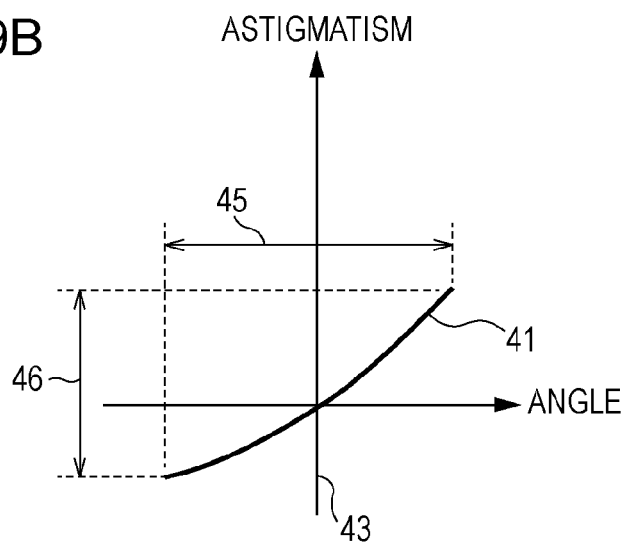
Figure 9C:
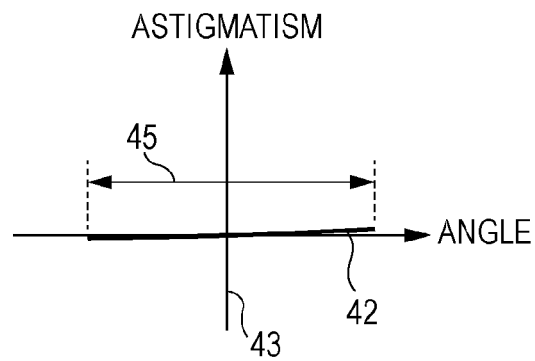

FIG. 9A illustrates astigmatism 40 generated when the parallel plate is arranged in a convergent light beam, like the imprint lithography apparatus 300 in FIG. 7. In FIGS. 9A to 9C, each horizontal axis indicates an incidence angle of principal rays on the parallel plate, and each vertical axis indicates an astigmatism amount. The incidence angle of the principal rays on the parallel plate varies depending on the image height. The principal rays are incident on the parallel plate at the center image height at an incidence angle 43. That is, astigmatism 44 is generated even at the center image height. If large astigmatism is generated at the center image height, the TTM detection system 7 cannot simultaneously perform measurement in the X and Y directions. The large astigmatism 44 at the center image height (the incidence angle 43) is a component generated because the parallel-plate-type beam splitter 20 is arranged obliquely with respect to the ZY plane.

Hence, to correct the large astigmatism 44, the parallel plate 24 used for correcting astigmatism is arranged obliquely with respect to the ZX plane. Thus, the astigmatism at the center image height can be corrected. The correction method is the method described above with reference to FIG. 8.

FIG. 9B illustrates astigmatism 41 at each image height (each incidence angle) that is corrected by arranging the parallel plate 24 used for correcting astigmatism is arranged obliquely with respect to the ZX plane. It is found that the astigmatism 44 having a component common to the angle of view at each image height generated in FIG. 9A can be corrected. However, as it is found through comparison between part (A) and part (C) of FIG. 6, if the angle of incidence on the parallel-plate-type beam splitter is different, the astigmatism amount 84 is different from the astigmatism amount 85.

In this embodiment, since the relay optical system 29 is the telecentric optical system, if a plurality of the TTM detection systems 7 are arranged, plural points of a wafer shot can be simultaneously measured. However, in the state in FIG. 9B, since astigmatism is not corrected except at the center image height (incidence angle 43), the measurement at an image height other than the center image height, which is a feature of the present invention, cannot be performed. A range of the image height where the TTM detection system 7 can perform measurement is indicated by a measurement image-height range 45 in FIG. 9B. If the astigmatism is corrected only by arranging the parallel plate 24 obliquely with respect to the ZX plane, it is found that a maximum astigmatism amount 46 is generated in the measurement image-height range 45. In order to simultaneously perform measurement in the X and Y directions at any image height in the measurement image-height range 45, it is preferable that the astigmatism amount 46 is corrected as possible.

Hence, the correction optical system 25 is used for correcting astigmatism. By decentering the correction optical system 25 in the Y and X directions, the astigmatism of the astigmatism amount 46 is corrected. By decentering a convex lens and a concave lens that form the correction optical system 25 as a unit, the astigmatism amount 46 at each image height, which is not completely corrected by the parallel plate 24, can be corrected.

FIG. 9C illustrates astigmatism 42 generated at each image height (each incidence angle), which is corrected by decentering the correction optical system 25 in the Y and X directions. Correction is performed so that astigmatism is almost not generated at any image height in the measurement image-height range 45, like the center image height (the incidence angle 43). Since astigmatism is corrected at any image height in the measurement image-height range 45, the plurality of TTM detection systems 7 can measure different points in a wafer shot.

Next, a method of correcting coma aberration of the relay optical system 29 is described. In this embodiment, the parallel plate 27 (a first coma correction optical member) for correcting coma aberration with the same shape as the parallel-plate-type beam splitter 20, and the parallel plate 28 (a second coma correction optical member) for correcting coma aberration with the shape as the parallel plate 24 for correcting astigmatism are arranged. By arranging the parallel plates 27 and 28, coma aberration of the relay optical system 29 is decreased.

The parallel plate 27 for correcting coma aberration is arranged to be rotationally symmetric with respect to the beam splitter 20 about the pupil space of the relay optical system 29 as the center while the X axis serves as the rotation axis, with reference to the ZY plane. Also, the parallel plate 28 for correcting coma aberration is arranged to be rotationally symmetric with respect to the parallel plate 24 about the pupil space of the relay optical system 29 as the center while the Y axis serves as the rotation axis, with reference to the ZX plane. As described above, since the parallel plates 27 and 28 for correcting coma aberration are arranged to be rotationally symmetric respectively with respect to the parallel-plate-type beam splitter 20 and the parallel plate 24 for correcting astigmatism about the center of the pupil space, generation of coma aberration at the relay optical system 29 can be reduced.

Meanwhile, in the above description, the correction optical system 25 has had to be decentered in the Y and X directions in order to correct astigmatism of the relay optical system 29 at any measurement image height. However, if the correction optical system 25 is decentered, the rotational symmetric arrangement about the center of the pupil space of the relay optical system 29 is no longer provided. Hence, coma aberration may be generated. If coma aberration is generated at the relay optical system, the coma aberration may be an error component when the TTM detection system performs alignment measurement, and measurement accuracy may be decreased. Owing to this, in this embodiment, the lens that forms the relay optical system is decentered when the correction optical system 25 is decentered. Thus, the influence of coma aberration is decreased.

Figure 10:
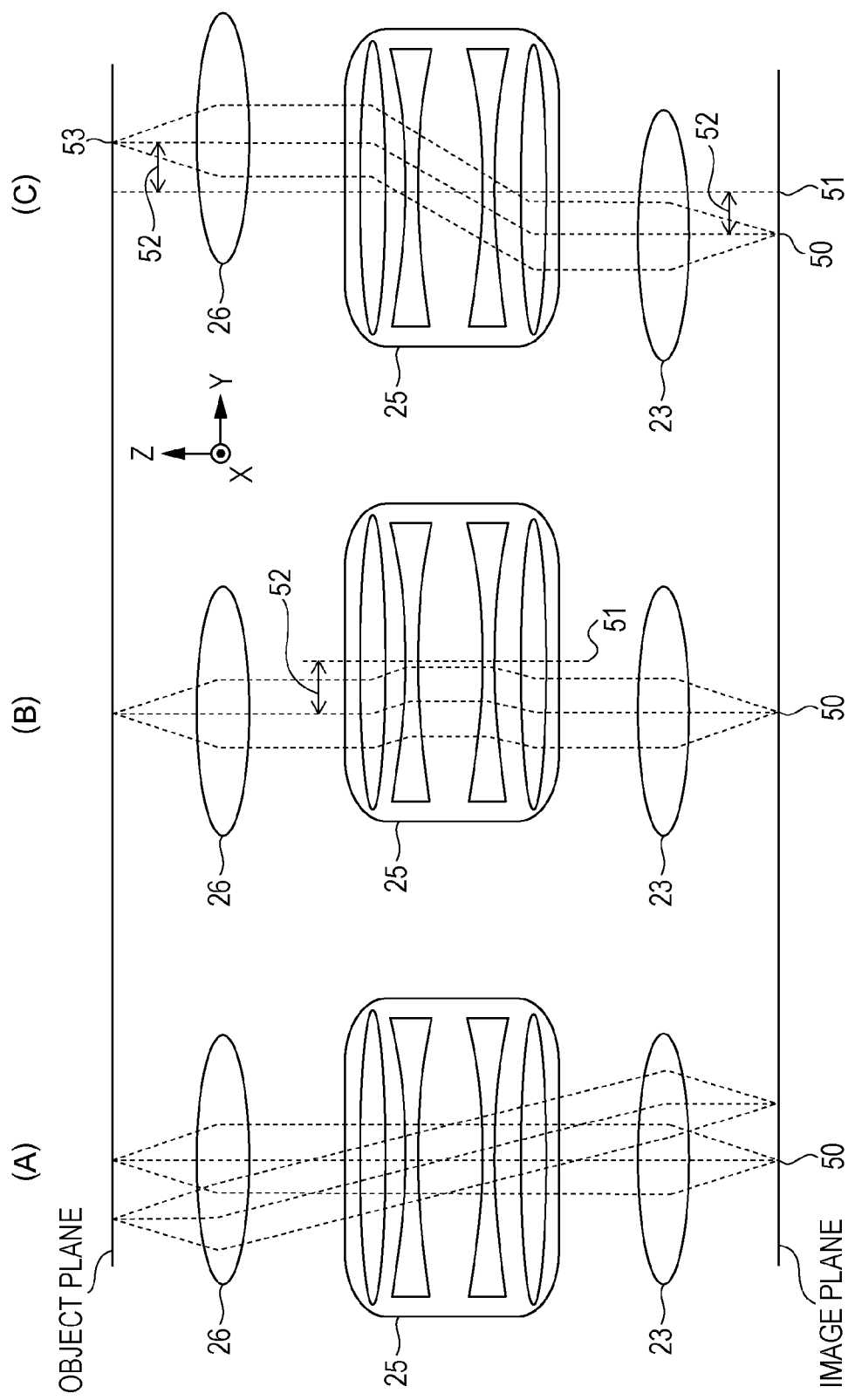
FIG. 10 illustrates correction of coma aberration by using a correction optical system and lenses.
Figures 11A, 11B, 11C:
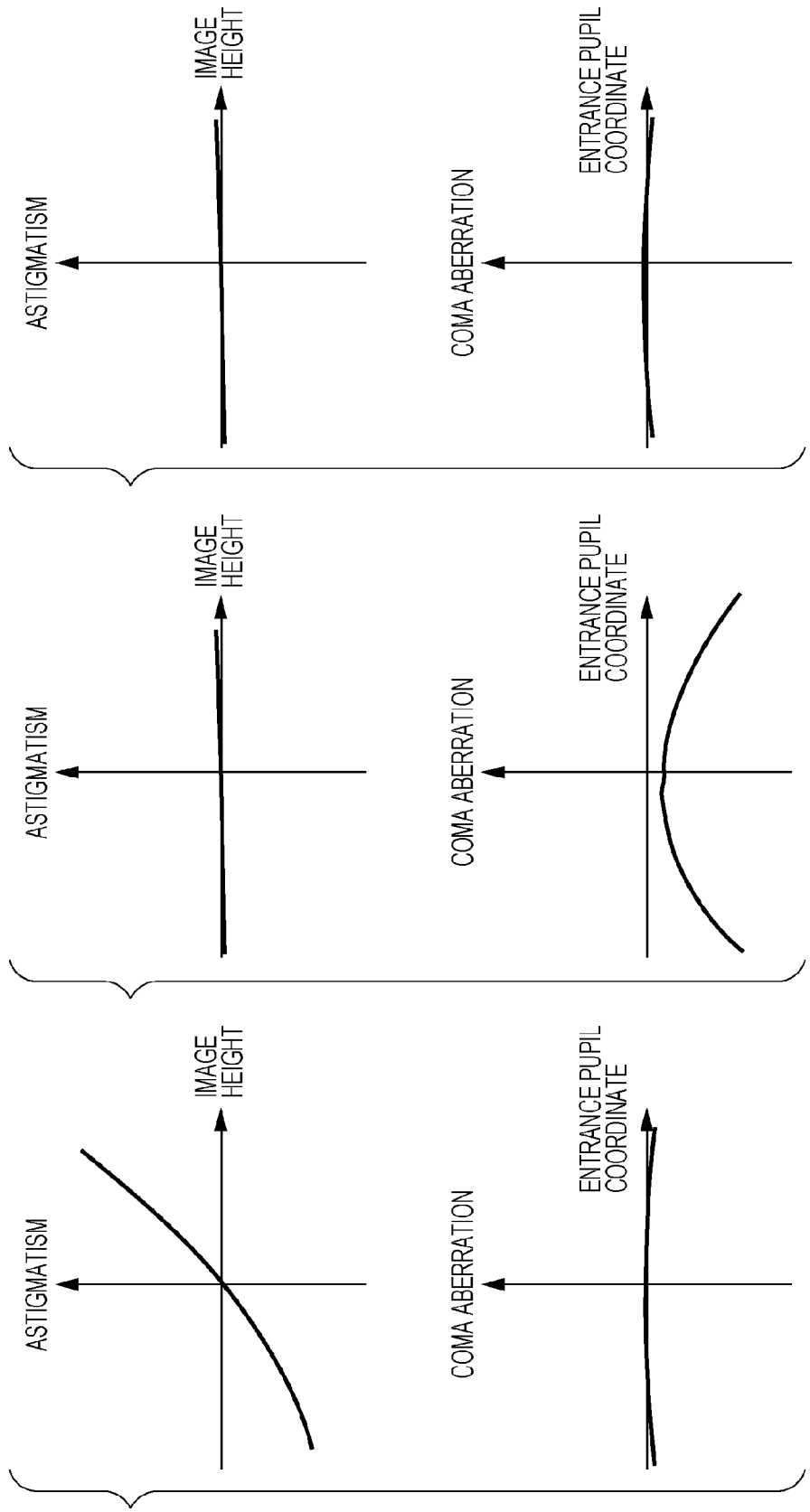
FIGS. 11A to 11C each illustrate astigmatism and coma aberration when the correction optical system is decentered.

FIG. 10 provides illustrations showing generation of coma aberration due to the decentered arrangement of the correction optical system 25, and its correction method. Part (A) of FIG. 10 illustrates a state of the optical system before astigmatism is corrected. FIG. 11A illustrates a state of astigmatism and coma aberration at this time. Referring to FIG. 11A, it is found that astigmatism is generated at each image height. However, a principal axis 50 of the lens 23 passes through the center of the correction optical system 25 and the center of the lens 26, and the optical system is rotationally symmetric around the center of the pupil space of the relay optical system. Hence, it is found that coma aberration is not generated in the optical system in part (A) of FIG. 10.

In order to correct astigmatism generated in part (A) of FIG. 10, the correction optical system 25 has to be decentered in the Y and X directions. Part (B) of FIG. 10 illustrates a state in which the correction optical system 25 is decentered in the Y direction. FIG. 11B illustrates a state of astigmatism and coma aberration at this time. By decentering the correction optical system 25, astigmatism at each image height generated in FIG. 11A can be corrected. However, since the correction optical system 25 is decentered, it is found that a principal axis 51 of the correction optical system 25 is not aligned with the principal axis 50 of the lenses 23 and 26. The principal axis 51 of the correction optical system 25 is decentered with respect to the principal axis 50 of the lens 23 only by a decentering amount 52. The optical system in part (B) of FIG. 10 is not rotationally symmetric about the center of the pupil space. Hence, coma aberration is generated.

Part (C) of FIG. 10 illustrates a state in which the correction optical system 25 is decentered and the lens 26 is decentered. FIG. 11C illustrates a state of astigmatism and coma aberration at this time. A principal axis 53 of the lens 26 is decentered from the principal axis 51 of the correction optical system 25 in the Y direction only by the decentering amount 52. This amount is the same as the decentering amount by which the principal axis 51 of the correction optical system 25 is decentered from the principal axis 50 of the lens 23. As shown in part (C) of FIG. 10, since the correction optical system 25 is decentered and simultaneously the lens 26 is decentered, generation of coma aberration at the relay optical system can be reduced (FIG. 11C).

FIG. 10 illustrates the lenses 26 and 23 and the correction optical system 25 in the relay optical system 29. However, coma aberration can be corrected similarly even if the beam splitter and the parallel plate are present. Also, in this embodiment, the correction optical system 25 is decentered in the Y direction; however, even if the correction optical system 25 is decentered in the X direction, the lens 26 may be similarly decentered in the X direction.

In the above description, coma aberration is corrected when the relay optical system 29 is at 1× magnification. However, coma aberration can be corrected even if the relay optical system 29 is not at 1× magnification. Here, an imprint lithography apparatus including a relay optical system 29 at 2× magnification is described. For correcting astigmatism of the relay optical system 29 at 2× magnification, the parallel plate 24 for correcting astigmatism and the correction optical system 25 are used like FIG. 7. Coma aberration of the relay optical system 29 at 2× magnification cannot be corrected merely by arranging the parallel plate for correcting astigmatism to be rotationally symmetric about the center of the pupil space as described above.

Owing to this, the parallel plates 27 and 28 use parallel plates with thicknesses different from those used in the relay optical system at 1× magnification. In this case, the thickness of the parallel plate 27 for correcting coma aberration is two times the thickness of the parallel-plate-type beam splitter 20, and the thickness of the parallel plate 28 for correcting coma aberration is two times the thickness of the parallel plate 24 for correcting astigmatism.

Table 1 shows the relationship of the magnification of the relay optical system, and the thickness and the angle (the inclination angle) of the object-side (wafer-side) parallel plate (20, 24) and the image-side parallel plate (27, 28). If the magnification of the relay optical system is 2×, the thickness of the image-side parallel plate is determined to be two times the thickness of the object-side parallel plate. Also, coma aberration can be corrected even by determining the angle at which the parallel plate is arranged to be doubled. If the parallel plate of the relay optical system at 1× magnification is arranged at 30 degrees, coma aberration can be corrected by arranging the parallel plate at 60 degrees that is two times the former angle. Even with the relay optical system at 2× magnification, coma aberration generated when the correction optical system 25 is decentered can be corrected by decentering the lenses 23 and 26 like the case at 1× magnification. The decentering amount of the lens at this time is not the same as the amount of the correction optical system 25 unlike the case at 1× magnification.

TABLE 1

| Magnification of relay optical system | Image-plane-side parallel plate | Object-plane-side parallel plate |
|---|---|---|
| 1× | Thickness: 3 mm<br>Angle: 30° | Thickness: 3 mm<br>Angle: 30° |
| 2× | | Thickness: 6 mm<br>Angle: 30°<br>Thickness: 3 mm<br>Angle: 60° |

The relay optical system at 2× magnification has been described here; however, astigmatism and coma aberration even for a relay optical system at other magnification can be corrected similarly. The thickness and angle of the parallel plate can be determined in accordance with the magnification of the relay optical system.

Also, in the above description, the telecentric relay optical system has been used. However, the present invention may be applied to a non-telecentric relay optical system. If the relay optical system is non-telecentric, on-axis astigmatism and off-axis astigmatism cannot be simultaneously corrected. However, one of on-axis astigmatism and off-axis astigmatism can be corrected. For example, if on-axis astigmatism is corrected, XY marks can be simultaneously measured at the on-axis. If off-axis astigmatism is corrected, XY marks can be simultaneously measured at the off-axis.

Also, in the above description, the beam splitter 20 has characteristics of transmitting the measurement light 8 of the TTM detection system 7 and reflecting the ultraviolet rays 3 emitted from the illumination system 2. However, the present invention may be applied to the imprint lithography apparatus as shown in FIG. 2 including the beam splitter 16 having characteristics of reflecting the measurement light 8 of the TTM detection system 7 and transmitting the ultraviolet rays 3 emitted from the illumination system 2.

With the imprint lithography apparatus including the optical system that corrects astigmatism as described above, coma aberration and astigmatism of the relay optical system can be corrected. With the imprint lithography apparatus to which the present invention is applied, the relative positions of the mold and the wafer can be detected with high accuracy, and when the mold is impressed, the mold can be positioned with the pattern of the base with high accuracy. Accordingly, this can make a contribution to an increase in yield of the device.

Device Manufacturing Method

A manufacturing method of a device (a semiconductor integrated circuit element, a liquid crystal display element, etc.) as a product includes a step of forming a pattern on a substrate (a wafer, a glass plate, a film-shaped substrate) by using the above-described imprint lithography apparatus. Further, the manufacturing method includes a step of etching the substrate having the pattern formed thereon. When other product, such as a patterned media (a recording medium) or an optical element, is manufactured, the manufacturing method may include other processing for processing the substrate having the pattern formed thereon, instead of the etching. The product manufacturing method according to this exemplary embodiment is advantageous for at least one of performance, quality, productivity, and production cost of the product.

The present invention is not limited to the above-described embodiment, and may be changed and modified in various manners without departing from the spirit and scope of the present invention. Therefore, the following claims are attached to disclose the scope of the present invention.

The object of the present invention is to increase the alignment accuracy between the substrate and the mold by increasing the numerical aperture of the TTM detection system.

This application claims the benefit of International Patent Application No. PCT/JP2011/079911, filed Dec. 22, 2011, which is hereby incorporated by reference herein in its entirety.

INDUSTRIAL APPLICABILITY

Suitable application is to a micro-processing technique that transfers a fine structure formed on a mold to a member to be processed such as imprint resin.

The invention claimed is:

1. An imprint apparatus that forms a pattern to an imprint material on a substrate by using a mold, the apparatus comprising:
an optical system;
a light-receiving element;
a detection optical system that guides light from a mark formed on the substrate and a mark formed on the mold to the light-receiving element via the optical system,
wherein an imaging plane of the substrate surface to be image-formed by the optical system is positioned between the optical system and the detection optical system;
wherein the detection optical system is movable along the imaging plane; and
an illumination system that emits illumination light for curing the imprint material;
wherein the optical system includes:
an optical element having a surface that transmits one of the illumination light and the light from the marks, and reflects the other; and
a plate-shaped optical member that corrects aberration generated by the optical element,
wherein an inclination direction of the plate-shaped optical member is different from an inclination direction of the surface of the optical element.

2. The apparatus according to claim 1, wherein the inclination direction of the plate-shaped optical member is a direction in which the inclination direction of the surface of the optical element is rotated by 90 degrees around an optical axis of the optical system.

3. The apparatus according to claim 1, wherein the plate-shaped optical member and the optical element are parallel plates with equivalent thicknesses.

4. The apparatus according to claim 1,
wherein the optical system includes a correction optical system that corrects astigmatism of the optical system, and
wherein the correction optical system is decentered with respect to the optical axis of the optical system.

5. The apparatus according to claim 4,
wherein the optical system includes an object-side lens arranged at a mold side of the optical system, and an image-side lens arranged at a detection optical system side of the optical system, and
wherein at least one of the object-side lens and the image-side lens is decentered so that a decentering amount of the object-side lens with respect to the correction optical system is equivalent to a decentering amount of the image-side lens with respect to the correction optical system, and a decentering direction of the object-side lens with respect to the correction optical system is opposite to a decentering direction of the image-side lens with respect to the correction optical system.

6. The apparatus according to claim 1,
wherein the optical system includes
a first coma correction optical member rotationally symmetrically arranged with respect to the optical element around a direction, as an axis of rotation, perpendicular to an inclination direction of a surface of the optical element which is perpendicular to an optical axis of a pupil space of the optical system, and
a second coma correction optical member rotationally symmetrically arranged with respect to the optical member around a direction, as an axis of rotation, perpendicular to an inclination direction of the optical element which is perpendicular to an optical axis of the pupil space of the optical system.

7. The apparatus according to claim 6, wherein the optical element and the first coma correction optical member are parallel plates with equivalent thicknesses, and the optical member and the second coma correction optical member are parallel plates with equivalent thicknesses.

8. The apparatus according to claim 6, wherein the first coma correction optical member and the second coma correction optical member are parallel plates, and thicknesses and inclination angles of the first coma correction optical member and the second coma correction optical member are determined in accordance with a magnification of the optical system.

9. The apparatus according to claim 1, wherein the optical system is a telecentric optical system that causes an entire shot region of the substrate to be focused at the imaging plane, and
wherein the detection optical system is capable of changing a position along the imaging plane so that a plurality of positions of the mark formed on the substrate is detected by the light-receiving element.

10. A device manufacturing method, comprising:
a step of forming a pattern on a substrate by using an imprint lithography apparatus; and
a step of processing the substrate having the pattern formed in the step, wherein the imprint lithography apparatus that uses a mold having a pattern formed thereon and transfers the pattern to an imprint material fed to a substrate, the apparatus comprising:
a light-receiving element;
a detection system that irradiates a mark formed on the substrate and a mark formed on the mold with light which is reflected therefrom, and guides the light reflected from the mark formed on the substrate and from the mark formed on the mold to the light-receiving element;
a relay optical system that causes the light reflected through the mold from the mark formed on the substrate and the mark formed on the mold to be focused between the mold and the detection system;
an illumination system that emits illumination light for curing the imprint material;
an optical element having a surface that transmits one of the illumination light and the light from the detection system and reflects the other; and
a plate-shaped optical member that corrects aberration of the relay optical system,
wherein the optical member is arranged in the relay optical system, and an inclination direction of the optical member is different from an inclination direction of the surface of the optical element.

11. An imprint apparatus that forms a pattern to an imprint material on a substrate by using a mold, the apparatus comprising:
an optical system;
a light-receiving element;
a detection optical system that guides light from a mark formed on the substrate and a mark formed on the mold to the light-receiving element via the optical system; and
an illumination system that emits illumination light for curing the imprint material,
wherein the optical system forms an image of light from a first substrate mark formed on the substrate and a first mold mark formed on the mold, and light from a second substrate mark formed on the substrate and a second mold mark formed on the mold, at an image plane located between the optical system and the detection optical system,
wherein the imprint apparatus includes a plurality of pairs of the light-receiving element and the detection optical system,
wherein the light from the first substrate mark and the first mold mark is guided to a light-receiving element of a first pair among the plurality of pairs by a detection optical system of the first pair, and the light from the second substrate mark and the second mold mark is guided to a light-receiving element of a second pair among the plurality of pairs by a detection optical system of the second pair, so that the light-receiving element detects the first substrate mark and the first mold mark the second substrate mark and the second mold mark in a single shot of the illumination light,
wherein the optical system includes:
an optical element having a surface that transmits either one of the illumination light and the light from the marks, and reflects the other; and
a plate-shaped optical member that corrects aberration generated by the optical element,
wherein an inclination direction of the plate-shaped optical member is different from an inclination direction of the surface of the optical element.

12. The imprint apparatus according to claim 1, wherein the optical element transmits the light from the marks and reflects the illumination light.

13. The imprint apparatus according to claim 11, wherein the optical element transmits the light from the marks and reflects the illumination light.

* * * * *